United States Patent [19]
Bustard et al.

[11] 3,977,813
[45] Aug. 31, 1976

[54] NOVEL GETTER AND PROCESS

[75] Inventors: Thomas Stratton Bustard, Ellicott City; David Earl Goslee, White Marsh, both of Md.

[73] Assignee: Nuclear Battery Corporation, Columbia, Md.

[22] Filed: Jan. 18, 1974

[21] Appl. No.: 434,693

Related U.S. Application Data

[63] Continuation-in-part of Ser. No. 189,840, Oct. 18, 1971, abandoned.

[52] U.S. Cl. .............................. 417/49; 252/181.4; 252/181.7
[51] Int. Cl.² .......................................... F04B 37/00
[58] Field of Search ............................. 417/48–51; 252/181.4, 181.7; 315/108, 111

[56]         References Cited
         UNITED STATES PATENTS

| | | | |
|---|---|---|---|
| 1,628,987 | 5/1927 | King | 417/48 |
| 2,043,724 | 6/1936 | Anderson | 417/48 |
| 2,060,861 | 11/1936 | Glans | 417/48 |
| 2,209,870 | 7/1940 | Anderson | 417/48 |
| 2,661,336 | 12/1953 | Lederer | 417/48 |
| 3,071,310 | 1/1963 | Hayashi et al. | 417/51 |
| 3,584,253 | 6/1971 | Wintzer | 417/51 |
| 3,669,567 | 6/1972 | Porta et al. | 417/48 |

FOREIGN PATENTS OR APPLICATIONS 424,123    9/1964    Japan .............................. 252/181.7

*Primary Examiner*—William L. Freeh
*Attorney, Agent, or Firm*—Fleit & Jacobson

[57]           ABSTRACT

Process for activating a getter composed of a porous barium pellet comprising maintaining a barium pellet in an inert atmosphere, placing the pellet in an enclosed chamber, evacuating the chamber and heating the evacuated chamber containing the pellet to about 800°F for about two hours to activate same by removing gases from the surfaces of the pellet and an activated barium getter comprising a perforated metal or alloy can preferably composed of tantalum containing a barium pellet which has been heated in a vacuum to about 800°F for about two hours.

13 Claims, 5 Drawing Figures

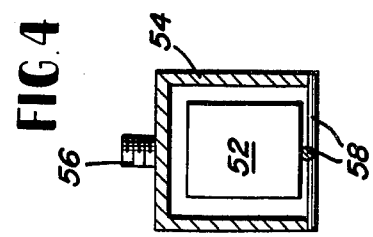
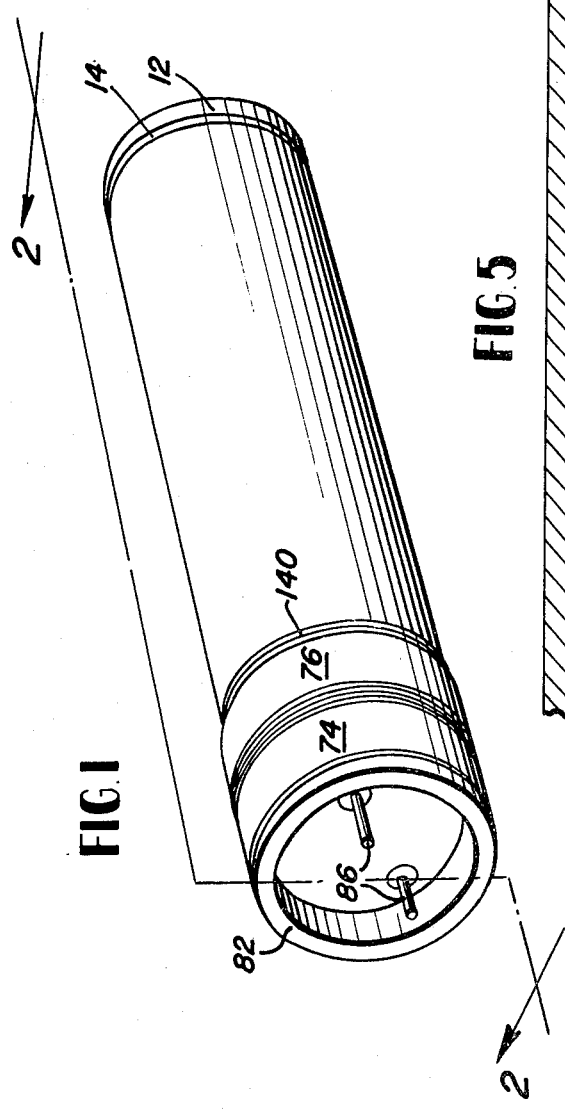
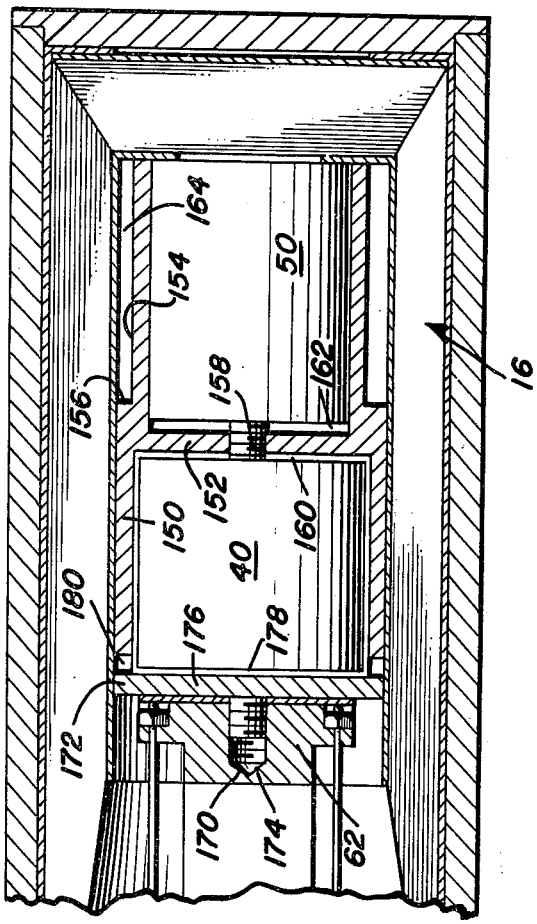

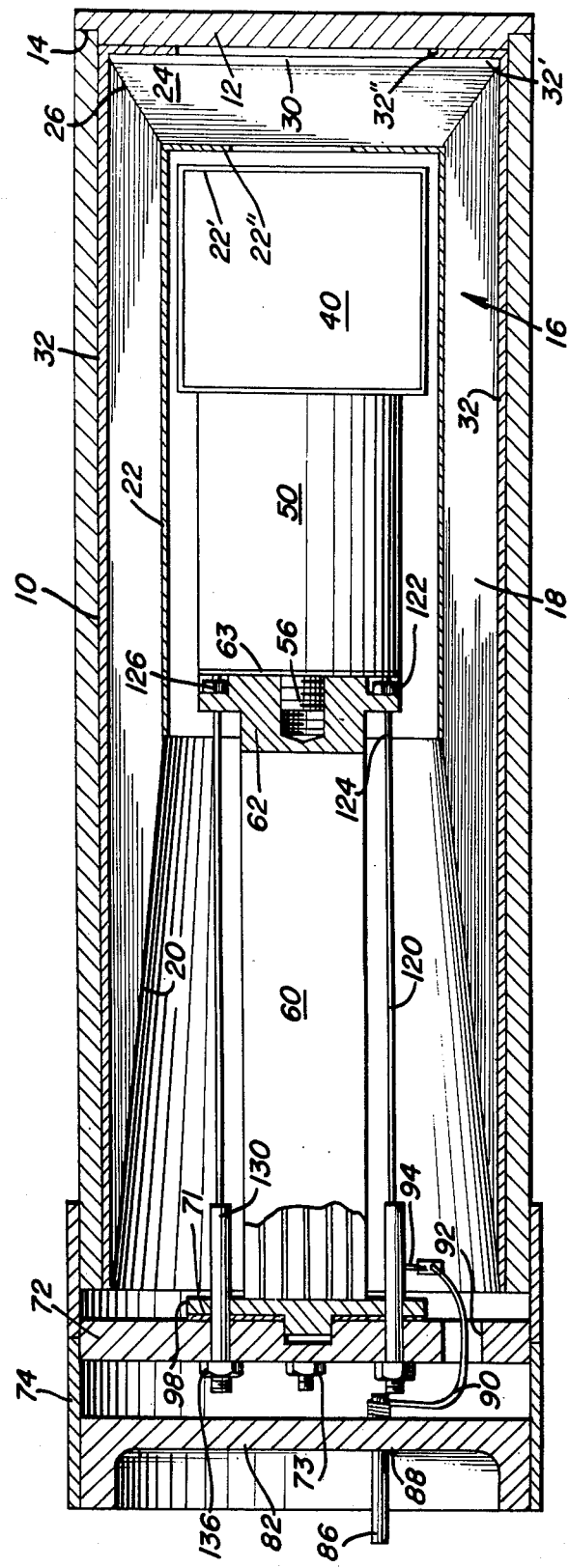

3,977,813

NOVEL GETTER AND PROCESS

REFERENCE TO RELATED APPLICATION

This is a continuation-in-part of U.S. Patent Application Ser. No. 189,840, filed on Oct. 18, 1971 and now abandoned.

BACKGROUND OF THE INVENTION

There are, at present, several devices implantable within a human body for aiding or supporting a bodily function. For instance, it is well known in the art that cardiac pacemakers have been implanted within the human body and serve as an electric heart pulser. Such devices require a source of energy which must also be implanted within the human body. In the past, chemical batteries have been employed for this purpose. These sources of electrical power have limited lifetimes and may last, on the average, for only one or two years after which a surgical procedure is necessary to replace the device.

Obviously, a person, in whom such a device has been implanted, who is not amenable to withstanding the shocks or stresses that one is subjected to during such surgical procedures, is benefited by any means which can serve to prolong the life of the electrical power supply.

Although it has been suggested that the electrical power supply should be a nuclear energy source and experimental work has been performed in this area, to date, no one has been able to develop a fully reliable and long-lasting nuclear electric power supply to power implantable devices.

SUMMARY OF THE INVENTION

The present invention relates to a microwatt thermoelectric generator, small in size, efficient in operation and which will last for a considerable period of time.

Accordingly, it is the principal object of the present invention to provide a microwatt thermoelectric generator that contains a nuclear power system to produce an electrical output suitable to service implanted electronic systems which generator will operate efficiently and effectively for longer time periods than such batteries or generators as are currently available. The devices of the present invention are intended to have power outputs of 150 microwatts or higher, operating at efficiencies of above 0.5% and more likely at 0.75% or above. Also, it is a principal object of the present invention to provide a generator as described that will be relatively small in size to be able to be well tolerated by the human body within spaces available for same and which will be extremely reliable in function.

The foregoing is accomplished by providing a unique nuclear power system essentially comprised of two subassemblies. One subassembly consists of an outer casing containing an insulation system and getter and a nuclear fuel capsule, and the other subassembly consists of a thermopile and a closure system. The nuclear fuel capsule may be made part of the other subassembly. The subassemblies are designed to be assembled and sealed at a single weld joint.

The getter system is considered to be a novel feature. The particular getter system configuration of the present invention enables performance at more efficient total power output from the smallest quantity of nuclear fuel, resulting in the least fuel cost for a generator. This feature gives the added advantage of the lowest possible radiation damage to surrounding tissue. The arrangement of the fuel capsule within the generator is considered to be a novel feature and is arranged to maintain the maximum possible temperature of the getter assembly while, at the same time, not overheating the thermopile. This concept assures maximum efficiency of both components despite quite different operating temperature requirements.

DETAILED DESCRIPTION OF THE SEVERAL VIEWS OF THE DRAWINGS

The foregoing objects of the invention and novel features are depicted in the accompanying drawings in which:

FIG. 1 is a view in perspective of the novel microwatt thermoelectric generator;

FIG. 2 is a vertical section of FIG. 1 taken along line 2—2 of FIG. 1;

FIG. 4 is a sectional view showing the mounting of the fuel capsule; and

FIG. 5 is a sectional view like FIG. 2 showing a preferred arrangement for the fuel capsule and getter assembly.

DETAILED DESCRIPTION OF A PREFERRED EMBODIMENT

Figure 3:
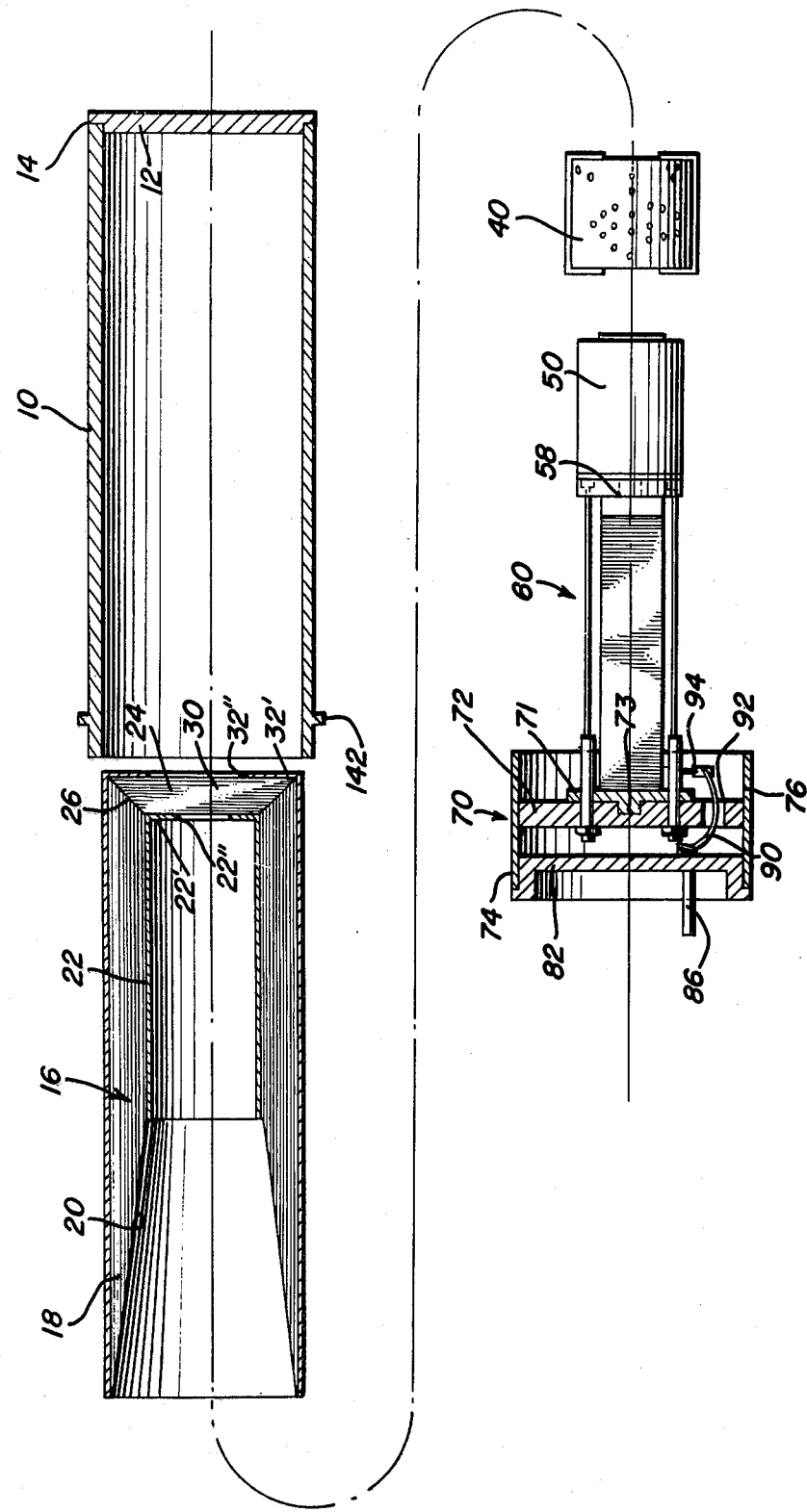
FIG. 3 is an exploded perspective view illustrating the manner of assembly.

Referring to the drawings, an embodiment of the invention will be described in detail. The novel microwatt thermoelectric generator of the present invention is capable of an electrical power output of 300-400 microwatts at approximately 0.3 volts using a nuclear power source equivalent to approximately 50 milliwatts of thermal energy. This is generally equivalent to 1/10 gram of a suitable form of plutonium (oxide). The generator consists of a cylindrical outer casing 10 which is closed at one end by a cap 12 by means of a weld joint 14. The joint is formed by electron beam welding or equivalent means to provide a vacuum-tight seal between the casing 10 and the cap 12. Within the casing 10 is positioned a foil insulation package generally designated by the reference numeral 16. The foil insulation package 16 which includes a spirally wrapped foil 18 which is tapered as indicated by reference numeral 20 from about the midpoint of the casing 10 to the end of the casing opposite the cap 12. The foil 18 is tapered to prevent the hotter portions (inner wraps) from conducting heat from the hot side to the cold side of the generator. It has been discovered that conduction of heat down the foils could constitute a substantial parasitic loss. The foil 18 laid out is trapezoidal in configuration and is wrapped about an inner can 22 a number of turns until it has reached a predetermined thickness. During this time, a series of disks 24 of increasing diameter are placed against the end 22' of the inner can 22 registering with the turns 18 of the foil insulation package along the bevel line 26. It will be noted that the end 22' of the inner can 22 is provided with a central opening 22" the purpose of which will become more apparent hereinafter. When a suitable number of foil turns 18 and disks 24 have been assembled about the inner can 22, a plate 30 is placed against the outer disk 24 and an open-mouthed outer can 32 is fitted over the plate 30 and encloses the foil insulation package 16. The outer can 32 is provided at its end 32' with an opening 32".

The insulation package is effective only in a vacuum and therefore a hard vacuum environment is required. Above approximately $10^{-3}$ torr or 10 microns pressure, the insulating properties of the package begin to degrade.

Located at the innermost part of the foil insulation is a getter assembly designated as 40. The getter assembly consists of a tantalum can provided with a plurality of holes in which is located a barium powder pellet. The can may be composed of other metals or alloys such as aluminum, titanium or stainless steel.

What has been described so far comprises one of the two major subassemblies of the microwatt thermoelectric generator and consists of three main components, namely, the outer casing 10 and end closure 12; the foil insulation package comprised of the wrappings 18 and the disks 24; and the getter assembly comprised of the perforated can with the barium pellet contained within. Since the microwatt thermoelectric generator is to be implanted within a human body with the electronic device it powers and since the effectiveness of the overall assembly is dependent in large measure upon maintenance of a vacuum within the casing, it is important that the getter have sufficient capacity to maintain the vacuum integrity for a long period of time and to be able to getter gases at a rate in excess of that at which they are produced. One of the important properties of the getter in this respect is the exposed surface area and, for this reason, although a solid barium pellet may be employed, it is believed that significant improvement is obtainable using a porous barium pellet or other configuration having high surface to volume ratio. In this respect, the density of the pellet is of importance due to the correlation with porosity.

The other subassembly of the generator comprises generally a fuel capsule 50, a thermopile assembly 60 and end cap 70.

The fuel capsule assembly consists of double cans 52 of a suitable containment material such as HASTELLOY C-276, a nickel base superalloy manufactured under this trade name by Stellite Division of Cabot Corporation of Kokomo, Indiana within which is positioned a suitable quantity of plutonium oxide having the desired and preferred properties and characteristics. The welded sealed double cans 52 are positioned loosely within an open skirt 54 comprised of stainless steel material which is provided on its closed end with a stud 56. The open cylinder 54 has a wall thickness of approximately 25 mils and two wires 58 are attached across its open end in cruciform pattern for the purpose of holding the double cans within the cylinder 54.

A cold plate 71 is provided at the other end of the thermopile. The faces of the aluminum plates 62 and 71 which bear against the thermopile are provided with an oxide coating which maintains electrical isolation while permitting desirable heat transfer. The cold plate 71 is provided with a central boss 73 which is received within a recess 73' defined centrally in the inside surface of a bearing plate 72. Outer rings or cylinders 74 and 76 of titanium are each welded at one end to the bearing plate 72 in a vacuum-tight manner with the weld joints being indicated by the reference numerals 78 and 80, respectively. Rings 74 and 76 may be composed of other suitable materials. The other end of the cylinder 74 is welded to an end closure plate or header of niobium 82 by a vacuum-tight joint 84. An electrical outlet or terminal 86 composed of niobium passes through the end plate 82 and is sealed in an alumina plug 88 which, in turn, is sealed in end plate 82. To assemble the microwatt thermoelectric generator, the container 10 is first welded to the end cap 12, and then the foil insulation package consisting of the wrappings 18 and disks 24 are inserted within the container 10 as previously described. Container 10 is comprised of tantalum, titanium or niobium, as are the bearing plate 72 and end plate 82. Likewise, the outlet or lead 86 is comprised of niobium, tantalum or titanium. Next, the getter assembly 40 comprised of the porous barium pellet contained within the perforated tantalum can having a wall thickness of 5 mils is inserted into the container and foil insulation package. The container is then placed in a vertical position with the open end upward and within an electron beam welding apparatus located in a vacuum chamber. The vacuum is drawn down to the desired level of $10^{-6}$ mm Hg, and then the barium pellet is heat treated in a novel manner to activate same and greatly enhance its getter properties. The barium pellet prior to this time has been maintained in an inert gas atmosphere (argon), and the surfaces are saturated with adsorbed argon and other gases. Accordingly, a heater is lowered into the container and placed in close proximity with the getter assembly and the temperature elevated to about 800°F where it is maintained for about two hours to outgas the barium. This procedure activates the barium and renders its surfaces more active, thereby greatly improving its efficiency to getter gases.

In the meantime, the other subassembly consisting of the fuel capsule, and the thermopile assembly, including its hot and cold plates, is outgassed at a temperature of about 500° F to about 550° F for 24 hours to one week and then assembled, together with the harness, the bearing plate 72, and end plate 82, and rings 74 and 76, the tension wires 120 having been brought to their proper load settings during this assembly.

The components of this other subassembly have been subjected to an outgassing at a temperature of about 500° F. This is an extremely advantageous procedure as it serves to minimize the load upon the getter and enables long and more efficient getter life. These subassembly components may be outgassed at such an elevated temperature because the shoes and electrical contacts have been connected to the thermopile in a special way and because of the thermal stability of the component materials. For example, the various alloy contacts made to the thermopile have high temperature, as well as non-poisoning characteristics, and, therefore, the thermopile may be subjected to this elevated temperature without danger that these contacts will be dislodged or deleterious diffusions will occur.

The other subassembly, prepared as described, is then brought into the first subassembly by lowering, fuel capsule first, into container 10. The final weld and sealing of the unit occurs at the joint 140 between the free end of the ring or cylinder 76 and the open end of the container 10. As will be noted, the cylinder 76 slides over the end of the container 10, and the weld joint is made between the edge of the cylinder 76 and a flange 142 defined by the container 10. As with all other weld joints, this one must be vacuum tight.

The preferred arrangement for the fuel capsule and getter is illustrated in FIG. 5. The fuel capsule 50 and getter assembly 40 are reversed inside the foil insulation package 16, and the getter assembly 40 is positioned between the fuel capsule 50 and thermopile assembly 60. In detail, a skirt or cylinder 150 is provided having a central transverse web 152 and a recessed part 154 defining a shoulder 156. The fuel capsule 50 is provided with a stud 158 which is received in a threaded bore 160 formed in web 152. A gold foil 162 is located between the fuel capsule 50 and web 152 to preclude a thermal gap. Insulating foils 164 like those of insulation package 16 are stacked in the recess defined by part 154. The getter assembly 40 is contained within the skirt 150. This configuration gives the highest operating temperature (about 400° F) for the getter assembly 40 and, therefore, provides the best gettering capability. The bottom of the thermopile (the hot plate 62) is provided with a threaded bore 170, and a skirt plate 172 with threaded stud 174 is connected to the hot plate 62 with a gold foil 176 interposed therebetween to prevent a thermal gap. The skirt plate 172 is separated from the end of the getter assembly by a gap 178 of 0.050 inches to provide a thermal shunt and essentially limit heat transfer to that heat which radiates from getter 40 and the top of cylinder 150. Located between the cylinder 150 and skirt plate 172 is a stack of insulating annular foils 180 like those of insulation package 16.

Tests have been conducted to determine the relationship between treating (activation) temperature and the capability of a barium pellet to getter. A single barium getter pellet was placed in a quartz tube fitted with an external tape heater. The pressure in the tube was monitored as a function of time and pellet temperature. The results of this test are presented below.

| Time | Tube Pressure | Pellet Temperature |
| --- | --- | --- |
| 12:15 MT | 52 $\mu$ | 70°F |
| 12:30 | 54 | 110 |
| 12:35 | — | — |
| 12:45 | 82 | 210 |
| 12:47 | — | — |
| 13:00 | 170. | 350 |
| 13:05 | — | — |
| 13:10 | — | — |
| 13:15 | 165 | 430 |
| 13:55 | 115 | 420 |
| 14:10 | 100 | 420 |
| 14:12 | — | — |
| 14:35 | 95 | 640 |
| 15:10 | 160 | 775 |
| 16:00 | 11 | 790 |
| 16:15 | — | 810 |
| 16:30 | 8 | 810 |
| 17:05 | 5 | 830 |

The dashes represent that no reading data is available.

From the above test results, there can clearly be seen a drastic decrease in pressure once the pellet has reached 775°F. It is believed that the increased gettering capability is the result of a rapidly increased chemical reactivity of the pellet.

Following the activation procedure described above, additional air was introduced to the tube so as to increase the tube pressure to a level of approximately 40 microns. It was found that the getter pellet consistently reduced the pressure in the tube to less than one micron within 20 minutes at a temperature of 400° to 500°F. From this, it can be concluded that the getter maintained its high reactivity even though its temperature was decreased from the 800°F activation level to a 400° to 500°F operating level. If the temperature of the getter were reduced even more, a further activation step may be necessary.

It should here be emphasized that the inventive activation procedure is scientifically quite different from that used in the vacuum tube industry where getters are "flashed". In the flashing process, the getter starts as a wire or other configuration. Application of a high electrical current causes the getter to be vaporized or flashed, and redeposited on the surface of the tube. Increased gettering capability is then achieved because of the enormous increase in surface area of the getter. The inventive process, on the other hand, involves no vaporization of the getter. The process is begun with a pellet, and after heating, a pellet remains. In fact, deliberate attempts are made to control the activation cycle to less than 850°F to suppress any possible getter vaporization. In this way, getter material does not become deposited over the interior of the thermoelectric generator, thereby avoiding any possibility of degrading reactions with other elements of the generator. In a glass vacuum tube, such problems of degrading reactions do not exist.

If the internal assembly of the total thermoelectric generator were thermally interconnected, the getter assembly would be functioning close to 200°F, and its efficiency would be greatly impaired. Thus, the getter assembly should be functioning at temperatures above 250°F and more preferably at about 400°F as noted in connection with the arrangement of FIG. 5. Coupled with this information is the further fact that the fuel capsule itself can generate a maximum temperature level dependent upon the limited quantity of nuclear fuel contained in the double cans 52.

To harmonize these various features and to achieve the maximum effect, the generator has been judiciously designed so that the getter will operate at a relatively high temperature and yet the hot end of the thermopile will be maintained at the preferred 200°F level. These results are achieved by the technique of locating the fuel container 52 within the cylinder 54 and leaving a thermal gap between the fuel capsule 52 and getter assembly 40, and the hot plate 62. This will allow the fuel container to operate at a higher temperature than would be possible if there would be good thermal contact. Also, in one form, the stainless steel spacer 63 inserted between the cylinder 54 and the hot plate 62 will provide further thermal resistance to assure the proper operating temperature of the hot plate 62. On the other hand, the getter will be exposed to the higher temperature of the capsule, and, since it is surrounded by maximum insulation, its operating temperature will be above 250°F.

It will thus be evident that a thermal drop has been purposely introduced between the fuel container 52 and the hot plate 62, and, although this would seem to be inconsistent with efficient operation of a thermoelectric generator, nevertheless, in the circumstances of the present case, this turns out to be necessary for efficient operation of the generator for the reasons explained.

Although the present invention has been described with reference to a preferred embodiment, various changes and modifications will be evident to those skilled in the art which do not depart from the inventive concepts taught herein.

What is claimed is:

1. A process for getter pumping in a container comprising the steps of:

activating a solid barium mass by raising the solid barium mass temperature to a temperature of about 800° F without vaporizing said solid barium mass and maintaining said about 800° F temperature for about two hours to outgas said solid barium mass.

2. The process of claim 1, wherein the pellet is a barium powder pellet.

3. The process of claim 1, wherein the pellet is preliminarily maintained in an inert atmosphere.

4. The process of claim 1, wherein said predetermined period of time is about two hours.

5. The process of claim 1, wherein the barium pellet is heated in a vacuum.

6. The process for getter pumping as defined in claim 1, further comprising the step of:
lowering the temperature of the activated solid barium mass to an operating temperature of about 400° F.

7. For use in a body implantable source of electrical energy in which a substantial vacuum must be maintained for efficient energy generation, a getter comprised of a barium pellet which has been activated by heating the barium pellet to a temperature of about 800°F for a predetermined period of time.

8. The getter of claim 7, and further comprising a casing for housing said barium pellet, said casing taking the form of a perforated can.

9. The getter of claim 6, wherein said can is composed of a material selected from the group consisting of tantalum, stainless steel, and their alloys.

10. A getter comprised of a barium pellet and activated by the process of: heating the barium pellet to a temperature of about 800°F; and maintaining the barium pellet at about 800°F for a predetermined period of time.

11. The getter of claim 10, wherein said barium pellet is preliminarily maintained in an inert gas atmosphere.

12. The getter of claim 10, wherein said barium pellet is heated in a vacuum.

13. The getter of claim 12, wherein said predetermined period of time is about 2 hours.

* * * * *